United States Patent
Liu et al.

(10) Patent No.: US 12,183,712 B2
(45) Date of Patent: Dec. 31, 2024

(54) METHOD AND SYSTEM FOR MANUFACTURING A SEMICONDUCTOR PACKAGE STRUCTURE

(71) Applicant: Advanced Semiconductor Engineering, Inc., Kaohsiung (TW)

(72) Inventors: Che-Ting Liu, Kaohsiung (TW); Jheng-Yu Hong, Kaohsiung (TW); Yu-Ting Lu, Kaohsiung (TW); Po-Chun Lee, Kaohsiung (TW); Chih-Hsiang Hsu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/089,458

(22) Filed: Dec. 27, 2022

(65) Prior Publication Data

US 2023/0138460 A1    May 4, 2023

Related U.S. Application Data

(63) Continuation of application No. 17/086,179, filed on Oct. 30, 2020, now Pat. No. 11,538,787.

(51) Int. Cl.
*H01L 21/56* (2006.01)
*H01L 21/67* (2006.01)
(Continued)

(52) U.S. Cl.
CPC ............ *H01L 24/96* (2013.01); *H01L 21/561* (2013.01); *H01L 21/568* (2013.01);
(Continued)

(58) Field of Classification Search
CPC ..... H01L 24/96; H01L 21/561; H01L 21/568; H01L 21/67092; H01L 21/67132;
(Continued)

(56) References Cited

U.S. PATENT DOCUMENTS

| | | | | |
|---|---|---|---|---|
| 2011/0012258 A1* | 1/2011 | Omandam | ......... | B23K 26/0006 257/737 |
| 2013/0210239 A1* | 8/2013 | Kim | .................. | H01L 21/02227 438/759 |

(Continued)

FOREIGN PATENT DOCUMENTS

| | | |
|---|---|---|
| CN | 104701195 B | 11/2019 |
| WO | WO-2019097819 A1 * | 5/2019 ............. B32B 27/00 |

OTHER PUBLICATIONS

Non-Final Office Action for U.S. Appl. No. 17/086,179, issued Apr. 1, 2022, 11 pages.

(Continued)

*Primary Examiner* — Evan G Clinton
(74) *Attorney, Agent, or Firm* — FOLEY & LARDNER LLP

(57) ABSTRACT

A method and a system for manufacturing a semiconductor package structure are provided. The method includes: (a) providing a package body including at least one semiconductor device encapsulated in an encapsulant; (b) providing a flattening force to the package body; (c) thinning the package body after (b); (d) attaching a film to the package body; and (e) releasing the flattening force after (d).

19 Claims, 16 Drawing Sheets

(51) Int. Cl.
*H01L 21/683* (2006.01)
*H01L 21/78* (2006.01)
*H01L 23/00* (2006.01)
*H01L 23/544* (2006.01)

(52) U.S. Cl.
CPC .. *H01L 21/67092* (2013.01); *H01L 21/67132* (2013.01); *H01L 21/67282* (2013.01); *H01L 21/6836* (2013.01); *H01L 21/6838* (2013.01); *H01L 21/78* (2013.01); *H01L 23/544* (2013.01); *H01L 2221/68327* (2013.01); *H01L 2224/95001* (2013.01); *H01L 2924/3511* (2013.01)

(58) Field of Classification Search
CPC ........... H01L 21/67282; H01L 21/6836; H01L 21/6838; H01L 21/78; H01L 23/544; H01L 2221/68327; H01L 2224/95001; H01L 2924/3511; H01L 24/19; H01L 21/67115; H01L 23/562; H01L 2224/18; H01L 21/56; H01L 21/67126; H01L 21/6835; H01L 2221/68381
See application file for complete search history.

(56) References Cited

U.S. PATENT DOCUMENTS

| | | | |
|---|---|---|---|
| 2016/0322251 A1* | 11/2016 | Takamoto | B32B 38/10 |
| 2017/0033026 A1* | 2/2017 | Ho | H01L 23/49827 |
| 2017/0271307 A1* | 9/2017 | Hiner | H01L 25/0655 |
| 2018/0096892 A1 | 4/2018 | Sandoh | |

OTHER PUBLICATIONS

Notice of Allowance for U.S. Appl. No. 17/086,179, issued Aug. 25, 2022, 7 pages.

* cited by examiner

METHOD AND SYSTEM FOR MANUFACTURING A SEMICONDUCTOR PACKAGE STRUCTURE

CROSS-REFERENCE TO RELATED APPLICATION

This application is a continuation of U.S. patent application Ser. No. 17/086,179 filed Oct. 30, 2020, now issued as U.S. Pat. No. 11,538,787, the contents of which is incorporated herein by reference in its entirety.

BACKGROUND

1. Field of the Disclosure

The present disclosure relates to a method and system for manufacturing a semiconductor package structure, and to a method including a thinning step and a system for accomplishing the same.

2. Description of the Related Art

In order to reduce a thickness of a semiconductor package structure, a molded wafer that is in an intermediate state of fabrication is thinned. However, the molded wafer may include a semiconductor die and a molding compound covering the semiconductor die. The thinned molded wafer may have a severe warpage due to the small thickness of the thinned molded wafer, and the CTE mismatch between the semiconductor die and the molding compound. Thus, the chuck may not handle the thinned molded wafer successfully. Thus, the following step may be difficult to be conducted to the warped and thinned molded wafer.

SUMMARY

In some embodiments, a method for manufacturing a semiconductor package structure includes: (a) providing a package body including at least one semiconductor device encapsulated in an encapsulant; (b) providing a flattening force to the package body; (c) thinning the package body after (b); (d) attaching a film to the package body; and (e) releasing the flattening force after (d).

In some embodiments, a system for manufacturing a semiconductor package structure includes a grinding unit, a film attaching unit and a tape removing unit. The grinding unit is used for grinding a package body with a tape. The film attaching unit is used for attaching a film to the package body. The tape removing unit is used for removing the tape from the package body. The film attaching unit is disposed between the grinding unit and the tape removing unit.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
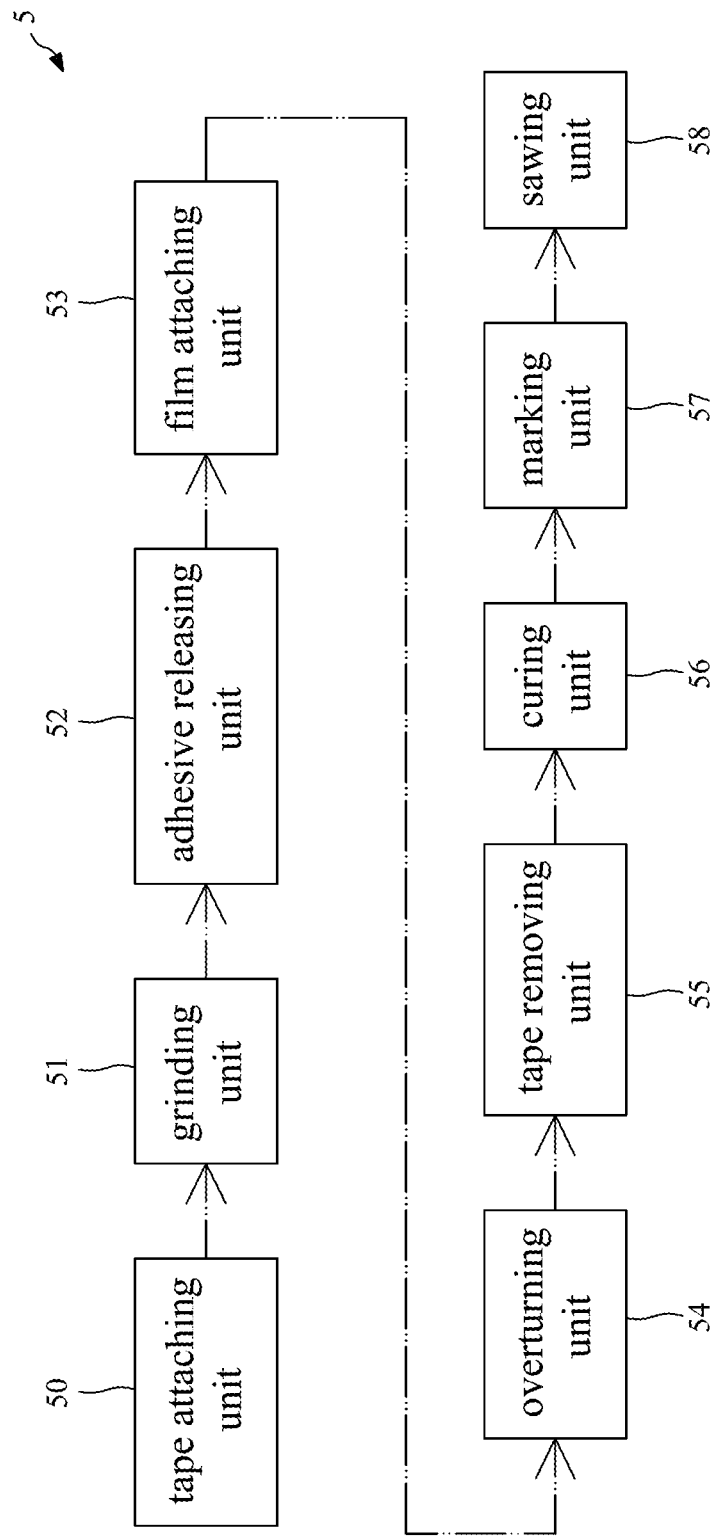
FIG. 1 illustrates a schematic arrangement of a system for manufacturing a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a schematic arrangement of a system 5 for manufacturing a semiconductor package structure according to some embodiments of the present disclosure. The system 5 may include a tape attaching unit 50, a grinding unit 51, an adhesive releasing unit 52, a film attaching unit 53, an overturning unit 54, a tape removing unit 55, a curing unit 56, a marking unit 57 and a sawing unit 58.

As shown in FIG. 1, the tape attaching unit 50, the grinding unit 51, the adhesive releasing unit 52, the film attaching unit 53, the overturning unit 54, the tape removing unit 55, the curing unit 56, the marking unit 57 and the sawing unit 58 may be disposed or arranged in sequence. That is, a workpiece may be sequentially processed in the tape attaching unit 50, the grinding unit 51, the adhesive releasing unit 52, the film attaching unit 53, the overturning unit 54, the tape removing unit 55, the curing unit 56, the marking unit 57 and the sawing unit 58. That is, the workpiece may be delivered or transferred in such order. For example, according to such arrangement, the film attaching unit 53 is disposed between the grinding unit 51 and the tape removing unit 55, and the overturning unit 54 is disposed between the film attaching unit 53 and the tape removing unit 55.

The tape attaching unit 50 and the film attaching unit 53 are used for attaching a tape of a film onto the workpiece. The grinding unit 51 is used for grinding a surface of the workpiece so as to thin the workpiece. The adhesive releasing unit 52 is used for releasing the adhesive of a tape on the workpiece. The overturning unit 54 is used for turning the workpiece over. The tape removing unit 55 is used for removing a tape from the workpiece. The curing unit 56 is used for curing or solidifying at least a portion of the workpiece. The marking unit 57 is used for forming a mark on or in the workpiece. The sawing unit 58 is used for sawing or cutting the workpiece into a plurality of singulated devices.

FIG. 2 through FIG. 11 illustrate a method for manufacturing a semiconductor package structure according to some embodiments of the present disclosure. In some embodiments, the method is for manufacturing the semiconductor package structure 6 shown in FIG. 11.

Figure 2:
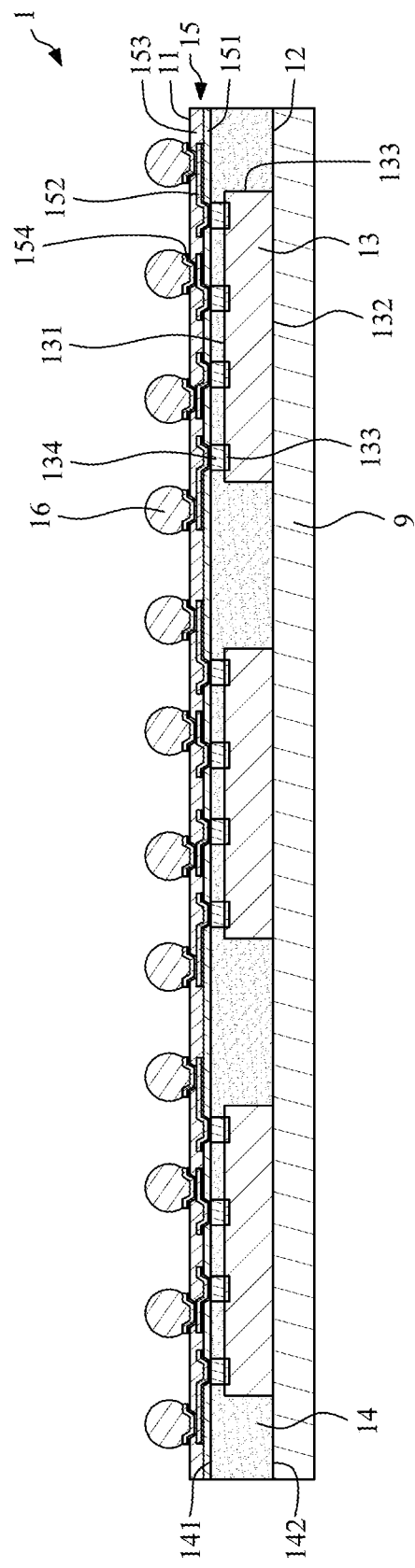
FIG. 2 illustrates one or more stages of an example of a method for manufacturing a semiconductor package structure according to some embodiments of the present disclosure.
Figure 3:
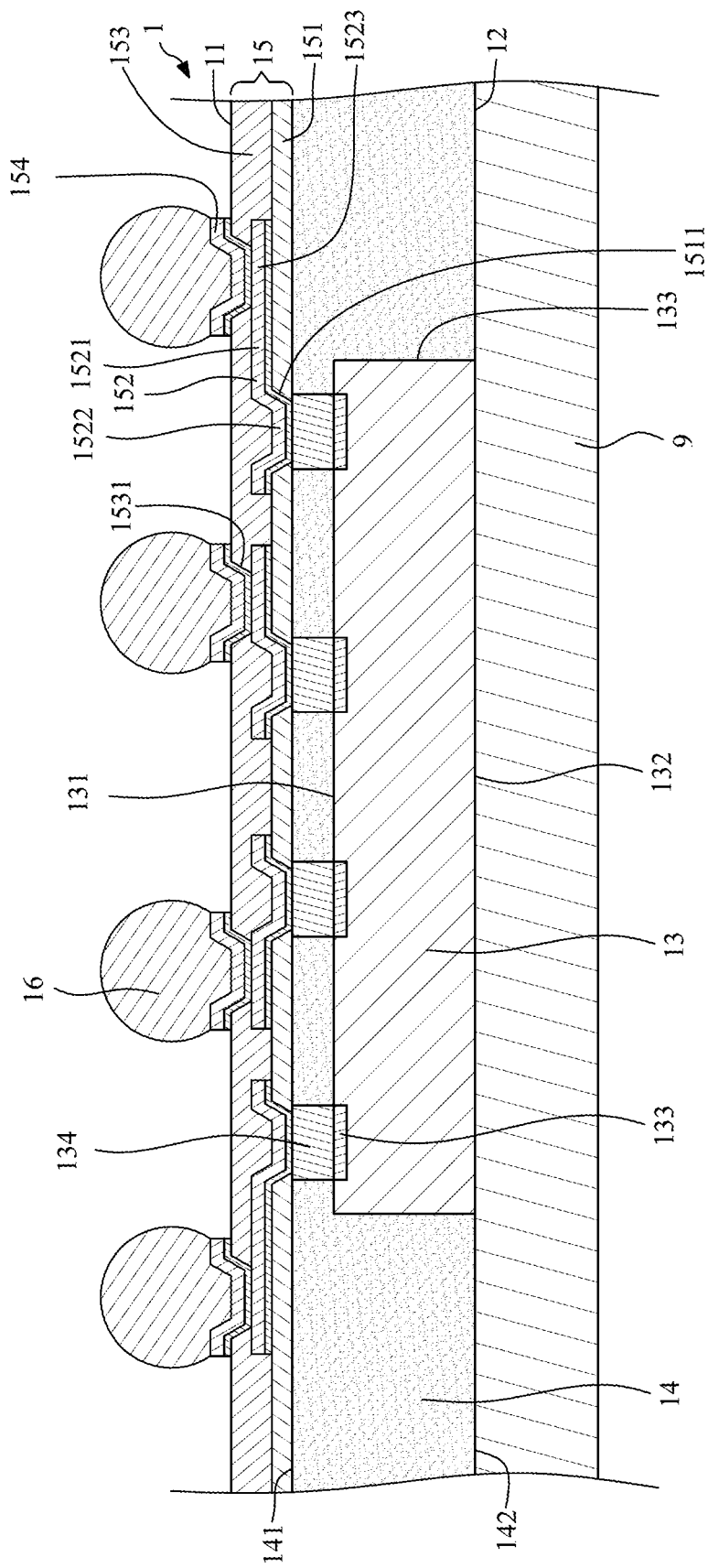
FIG. 3 illustrates one or more stages of an example of a method for manufacturing a semiconductor package structure according to some embodiments of the present disclosure.

Referring to FIG. 2 and FIG. 3, wherein FIG. 3 illustrates a partially enlarged view of a region of the package body 1 in FIG. 2, a package body 1 may be formed on a carrier 9. The carrier 9 may be a glass carrier, and may be in a wafer type, a panel type or a strip type. The package body 1 may be in a molded wafer type or in a molded panel type, and may have a first surface 11 (e.g., a top surface) and a second surface 12 (e.g., a bottom surface) opposite to the first surface 11. The package body 1 may include at least one semiconductor device 13, an encapsulant 14, a redistribution structure 15, a plurality of under bump metallurgies (UBMs) 154 and a plurality of external connectors 16. The at least one semiconductor device 13 may include a plurality of semiconductor dice 13 disposed side by side. The semiconductor device 13 has a first surface 131 (e.g., an active surface), a second surface 132 (e.g., a backside surface) and a lateral side surface 133. The first surface 131 (e.g., an active surface) of the semiconductor device 13 is adjacent to the first surface 11 of the package body 1. That is, the first surface 11 of the package body 1 is nearer the first surface 131 (e.g., an active surface) of the semiconductor device 13 than the second surface 12 of the package body 1 is. A distance between the first surface 11 of the package body 1 and the first surface 131 (e.g., an active surface) is less than a distance between the second surface 12 of the package body 1 and the first surface 131 (e.g., an active surface) of the semiconductor device 13. The second surface 132 is opposite to the first surface 131, and the lateral side surface 133 extends between the first surface 131 and the second surface 132. The second surface 132 of the semiconductor device 13 may be disposed on or attached to the carrier 9. The semiconductor device 13 may include a plurality of conductive pads 133 and a plurality of stud bumps 134. The conductive pads 133 may include copper, aluminum or gold, and may be disposed adjacent to or exposed from the first surface 131 of the semiconductor device 13. The stud bumps 134 may be disposed on the conductive pads 133 and may protrude from the first surface 131 of the semiconductor device 13. In some embodiments, the stud bump 134 may include copper (Cu), and may be in a pillar form.

The encapsulant 14 may be a cured molding compound with or without fillers. The encapsulant 14 may cover the carrier 9, the second surface 132 of the semiconductor device 13, the lateral side surface 133 of the semiconductor device 13 and the stud bumps 134 of the semiconductor device 13. Thus, the encapsulant 14 encapsulates the stud bumps 134 and the semiconductor device 13. The semiconductor device 13 is encapsulated in the encapsulant 14. The encapsulant 14 has a first surface 141 and a second surface 142 opposite to the first surface 141. In some embodiments, the first surface 141 of the encapsulant 14 may be ground, and the top surfaces of the stud bumps 134 may be substantially coplanar with the first surface 141 of the encapsulant 14. Thus, the top surfaces of the stud bumps 134 may be exposed from the first surface 141 of the encapsulant 14. The second surface 132 of the semiconductor device 13 may be substantially coplanar with the second surface 142 of the encapsulant 14, and they may be the second surface 12 of the package body 1.

The redistribution structure 15 may be disposed on the first surface 141 of the encapsulant 14, and may include a first dielectric layer 151, an interconnection structure 152 and a second dielectric layer 153. The first dielectric layer 151 may cover the encapsulant 14, and may define a plurality of openings 1511 to expose the top surfaces of the stud bumps 134. In some embodiments, the first dielectric layer 151 may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof.

The interconnection structure 152 may be formed on a top surface of the first dielectric layer 151 and in the openings 1511 of the first dielectric layer 151. The interconnection structure 152 may be a fan-out redistribution layer or a fan-in redistribution layer. For example, the interconnection structure 152 may include a plurality of conductive traces 1521 and a plurality of conductive pads 1522, 1523. The conductive pads 1522 may be disposed in the openings 1511 of the first dielectric layer 151 and contact the top surfaces of the stud bumps 134. The conductive pads 1523 may be disposed right under the UBMs 154 and may be also referred to as "capture lands". The conductive traces 1521 extend between the conductive pads 1522, 1523. In some embodiments, the conductive traces 1521 and the conductive pads 1522, 1523 may be formed integrally and concurrently. As shown in FIG. 2 and FIG. 3, the interconnection structure 152 may include one circuit layer; however, in other embodiments, the interconnection structure 152 may include a plurality of circuit layers electrically connected to one another.

The second dielectric layer 153 may cover the first dielectric layer 151 and the interconnection structure 152, and may define a plurality of openings 1531 to expose the conductive pads 1523 (i.e., the capture lands) of the interconnection structure 152. In some embodiments, the second dielectric layer 153 may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof.

The UBMs 154 may be formed on a top surface of the second dielectric layer 153 and in the openings 1531 of the second dielectric layer 153 so as to contact the conductive pads 1523 (i.e., the capture lands) of the interconnection structure 152. The external connectors 16 (e.g., solder balls) may be formed or disposed on the UBMs 154. Thus, the external connectors 16 are disposed on the redistribution structure 15.

Figure 4:
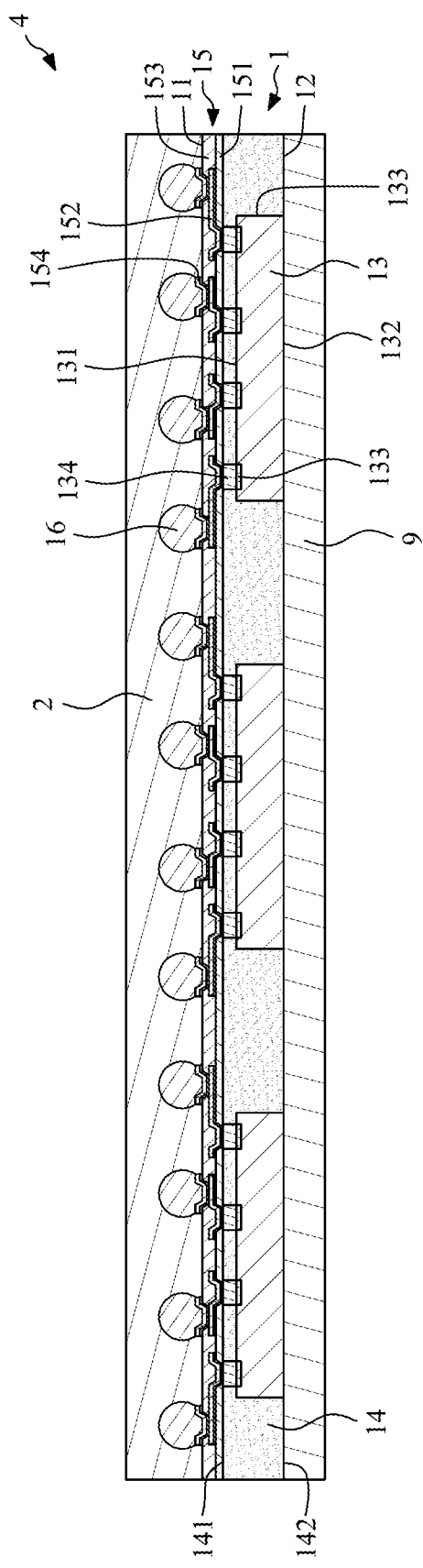
FIG. 4 illustrates one or more stages of an example of a method for manufacturing a semiconductor package structure according to some embodiments of the present disclosure.

Referring to FIG. 4, a flattening force may be provided or applied to the package body 1. In some embodiments, the package body 1 and the carrier 9 may be provided or moved to the tape attaching unit 50 (FIG. 1). In the tape attaching unit 50, a tape 2 may be attached to or disposed on the first surface 11 of the package body 1 to cover the redistribution structure 15 of the package body 1 and the external connectors 16. That is, the tape attaching unit 50 may be used for attaching the tape 2 to the first surface 11 of the package body 1. In some embodiments, the tape 2 may be a back grinding (BG) tape, and a thickness of the tape 2 may be greater than a thickness of the package body 1. For example, the thickness of the tape 2 may be about 500 μm, and the thickness of the package body 1 may be about 300 μm. Meanwhile, an assembly 4 including the tape 2, the package body 1 and the carrier 9 is formed. In addition, the thick tape 2 (e.g., the BG tape) may provide stiffness and rigidity, which may provide flattening force to the package body 1 and reduce the warpage of the package body 1.

Figure 4A:
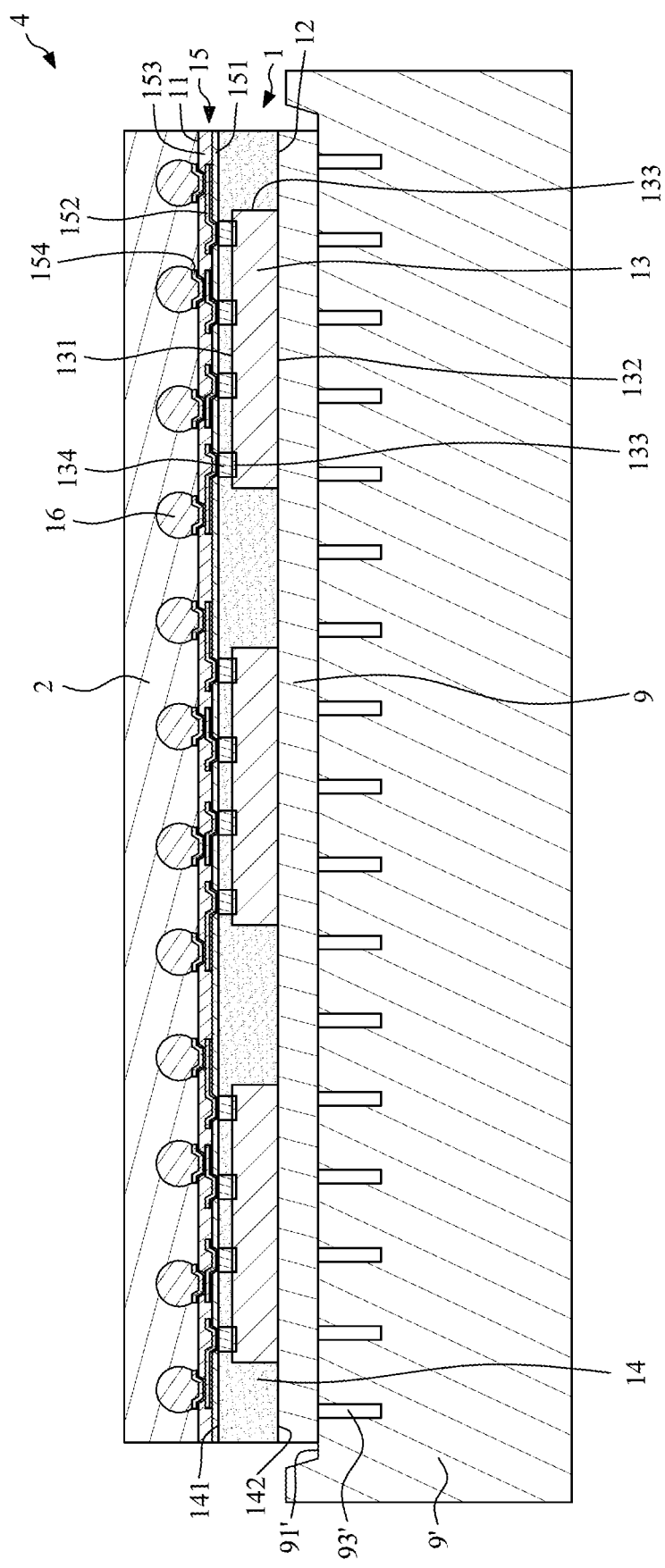
FIG. 4A illustrates one or more stages of an example of a method for manufacturing a semiconductor package structure according to some embodiments of the present disclosure.

Referring to FIG. 4A, the flattening force may be further provided or applied to the package body 1 by holding the package body 1 on a flattening chuck 9'. As shown in FIG. 4A, the assembly 4 of the tape 2, the package body 1 and the carrier 9 is attached to or fixed on a flattening chuck 9' by suction, for example, vacuum suction. That is, the flattening chuck 9' is utilized to suck the assembly 4 of the tape 2, the package body 1 and the carrier 9. The flattening chuck 9' has a receiving surface 91', and includes a plurality of suction holes 93'. Each of the suction holes 93' is communicated with a vacuum source, and has an opening at the receiving surface 91'. In some embodiments, the assembly 4 is sucked on the receiving surface 91' of the flattening chuck 9' through the suction holes 93'. The carrier 9 of the assembly 4 may contact the receiving surface 91' of the flattening chuck 9'. The flattening chuck 9' may provide suction force to the entire package body 1, which may provide flattening force to the package body 1 and reduce the warpage of the package body 1.

Figure 5:
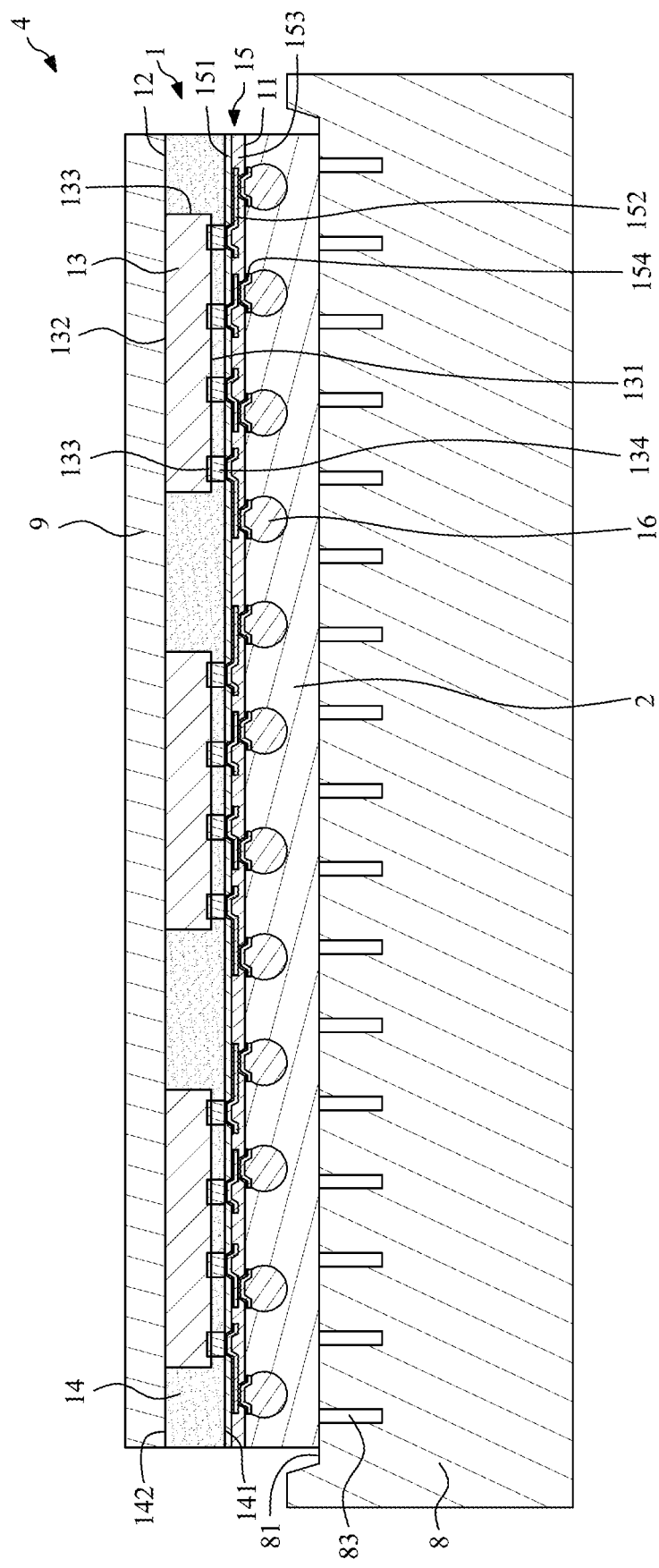
FIG. 5 illustrates one or more stages of an example of a method for manufacturing a semiconductor package structure according to some embodiments of the present disclosure.

Referring to FIG. 5, the assembly 4 of the tape 2, the package body 1 and the carrier 9 is attached to or fixed on a first chuck 8 by suction, for example, vacuum suction. That is, the first chuck 8 is utilized to suck the assembly 4 of the tape 2, the package body 1 and the carrier 9. The first chuck 8 has a receiving surface 81, and includes a plurality of suction holes 83. Each of the suction holes 83 is communicated with a vacuum source, and has an opening at the receiving surface 81. In some embodiments, the assembly 4 is sucked on the receiving surface 81 of the first chuck 8 through the suction holes 83. The tape 2 of the assembly 4 may contact the receiving surface 81 of the first chuck 8.

Figure 6:
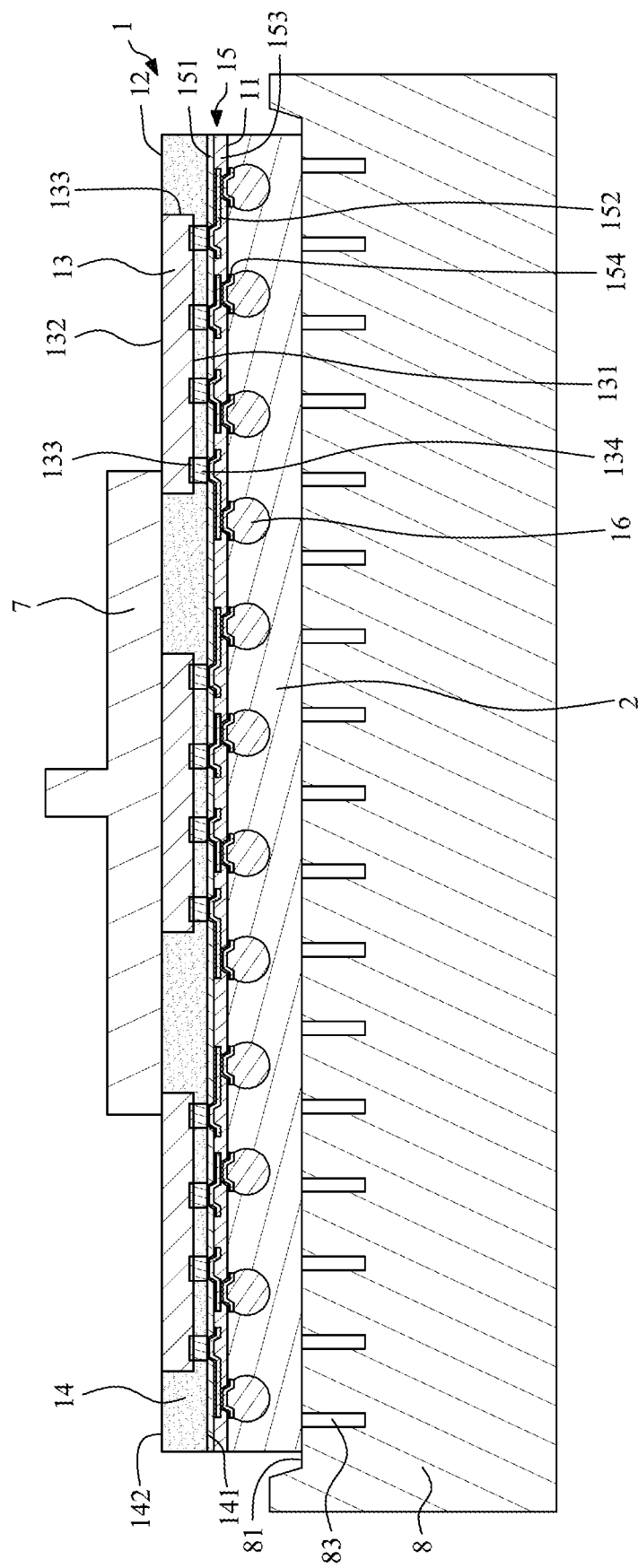
FIG. 6 illustrates one or more stages of an example of a method for manufacturing a semiconductor package structure according to some embodiments of the present disclosure.

Referring to FIG. 6, the assembly 4 and the first chuck 8 may be provided or moved to the grinding unit 51 (FIG. 1). In the grinding unit 51, the carrier 9 is removed, and the second surface 12 of the package body 1 is ground by the grinding head 7. Thus, the package body 1 is thinned from the second surface 12 of the package body 1. During the grinding process, the tape 2 (e.g., a back grinding (BG) tape) can provide buffer, so as to protect the external connectors 16 from damage caused by the press of the grinding head 7.

Figure 7:
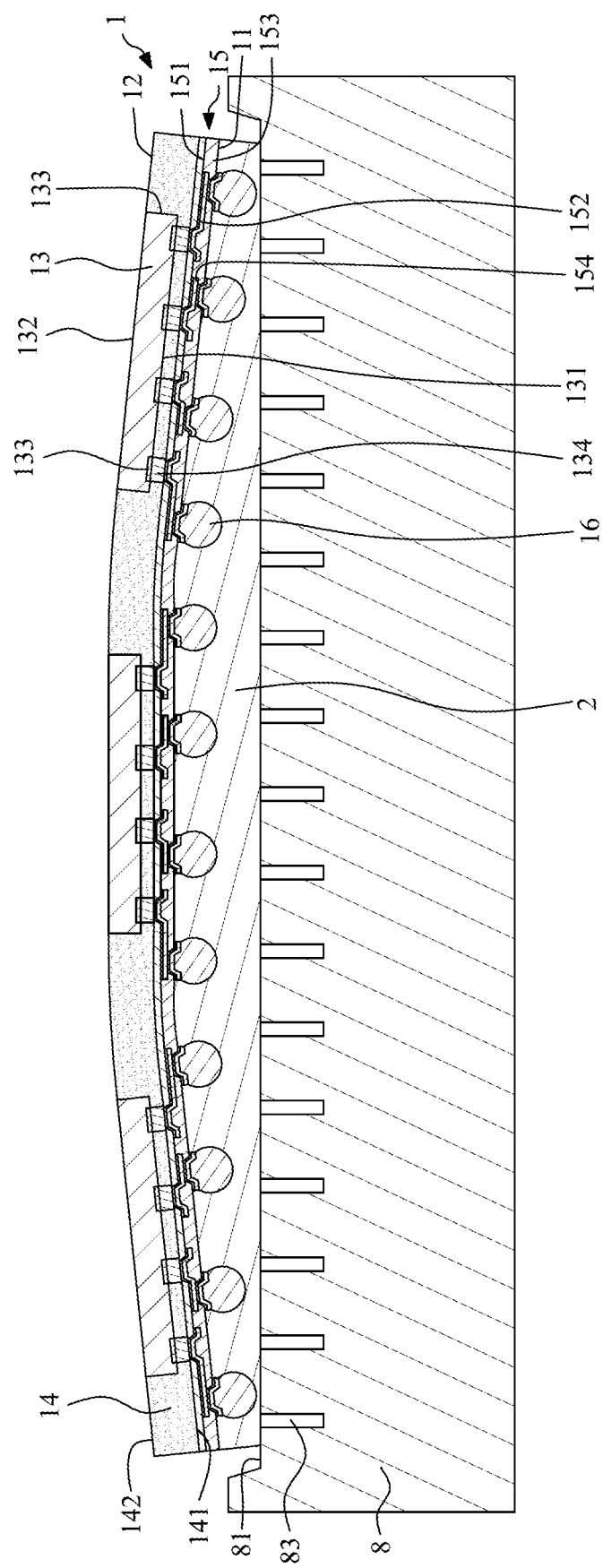
FIG. 7 illustrates one or more stages of an example of a method for manufacturing a semiconductor package structure according to some embodiments of the present disclosure.

Referring to FIG. 7, after the grinding head 7 is removed from the thinned package body 1, the thinned package body 1 may have a large warpage due to the thinness of the thinned package body 1, and the CTE (coefficient of thermal expansion) mismatch between the encapsulant 14, the semiconductor devices 13 and the redistribution structure 15. In some embodiments, the large warpage may be greater than 7 μm.

Then, the thinned package body 1 and the tape 2 that are sucked on the first chuck 8 may be provided or moved to the adhesive releasing unit 52 (FIG. 1). The adhesive releasing unit 52 may include a light irradiation source such as a UV (Ultra Violet) light source. In the adhesive releasing unit 52, the tape 2 is irradiated by the UV light so that the adhesive of the tape 2 is reduced or released. That is, the adhesive releasing unit 52 may be used for releasing the adhesive of the tape 2.

Figure 8:
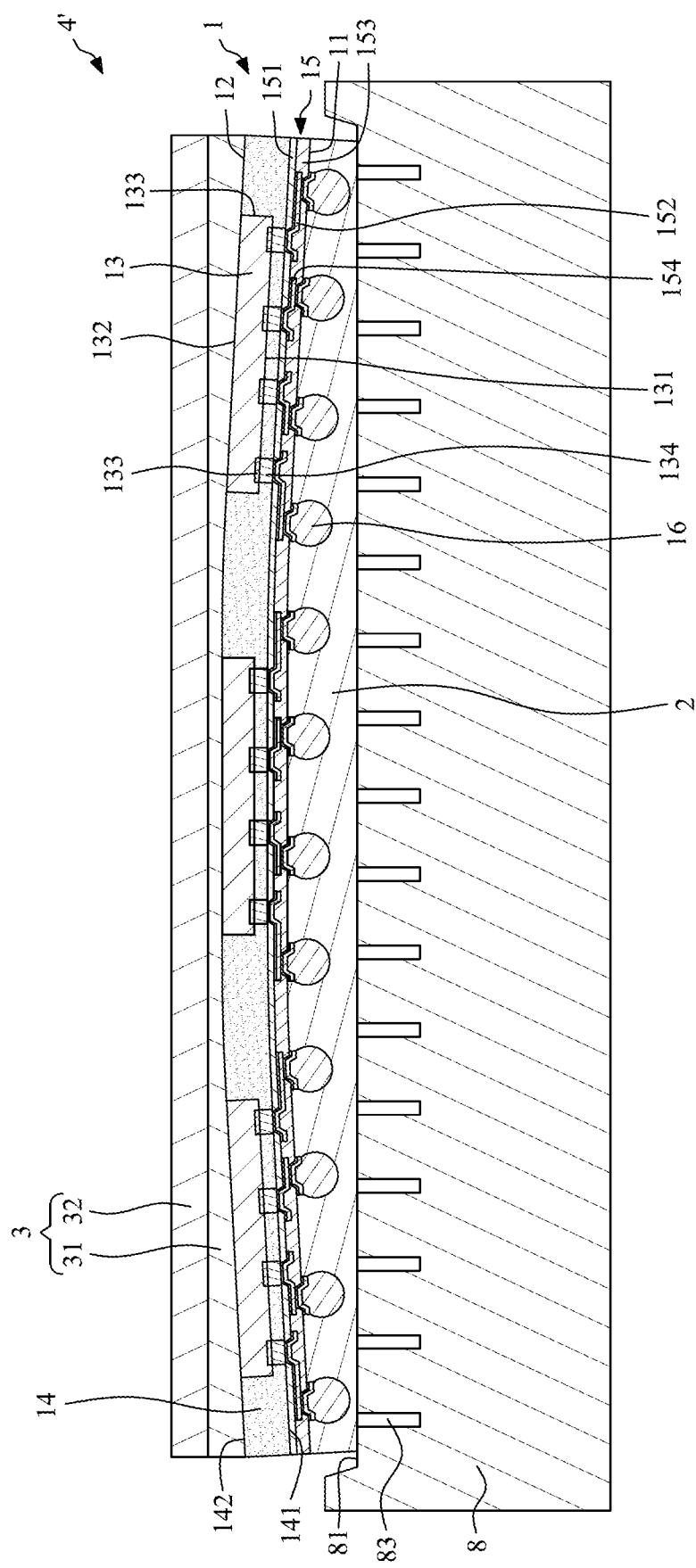
FIG. 8 illustrates one or more stages of an example of a method for manufacturing a semiconductor package structure according to some embodiments of the present disclosure.

Referring to FIG. 8, the thinned package body 1 and the tape 2 that are sucked on the first chuck 8 may be provided or moved to the film attaching unit 53 (FIG. 1). In the film attaching unit 53, a film 3 may be attached to or disposed on the second surface 12 of the package body 1. That is, the film attaching unit 53 may be used for attaching the film 3 to the second surface 12 of the package body 1. In some embodiments, the film 3 may be a pre-cut lamination film. For example, the pre-cut lamination film may be a double-layered structure that includes a back side coating film (or back side film) 31 and a dicing tape 32. That is, the pre-cut lamination film may be a combination of the dicing tape 32 and the back side coating film 31. The back side coating film 31 may be used for forming a mark thereon, and a thickness of the back side coating film 31 may be about 25 μm to about 40 μm. The dicing tape 32 may be used in a dicing step or a sawing step, and a thickness of the dicing tape 32 may be about 80 μm to about 100 μm. Meanwhile, an assembly 4' including the tape 2, the package body 1 and the film 3 is formed.

In the illustrated embodiment, the film 3 is attached to the package body 1 before the tape 2 (e.g., the BG tape) is removed. That is, the package body 1 may be interposed between the tape 2 (e.g., the BG tape) and the film 3. Thus, the film 3 can be attached to the package body 1 easily since the package body 1 has a small warpage such as a warpage of less than 7 μm. In a comparative embodiment, the film 3 is attached to the package body 1 after the tape 2 (e.g., the BG tape) is removed. When the tape 2 (e.g., the BG tape) is removed from the thinned package body 1, the thinned package body 1 may have a severe warpage (e.g., a warpage of greater than 7 μm) and may be difficult to be sucked by a chuck. As a result, the film 3 is difficult to be attached to the package body 1 in the subsequent stage. Further, in the illustrated embodiment, the thick tape 2 (e.g., the BG tape) may provide stiffness and rigidity, which may reduce the warpage of the package body 1. In addition, in the illustrated embodiment, the film 3 may be attached to the second surface 12 of the package body 1 by a roller. Thus, the warpage of the package body 1 may be reduced due to the press force of the roller.

Figure 9:
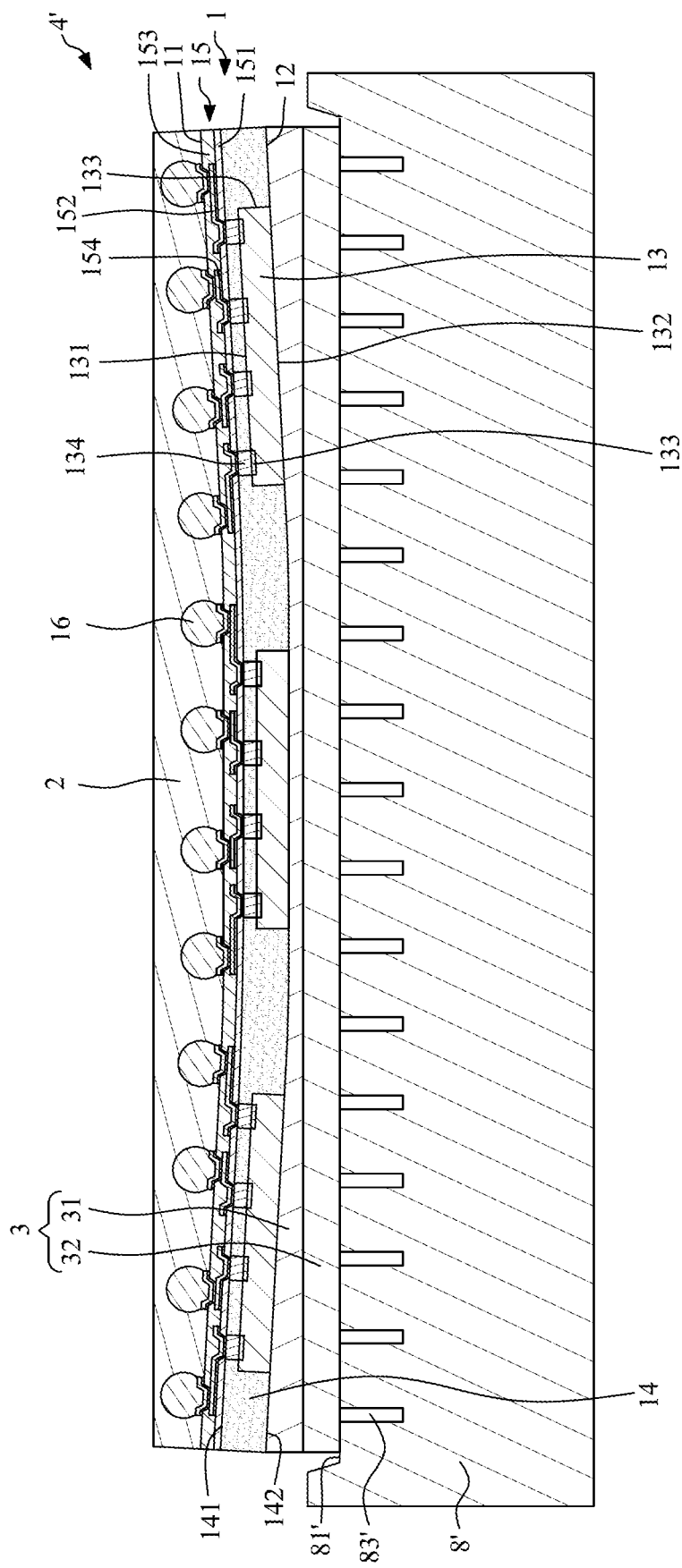
FIG. 9 illustrates one or more stages of an example of a method for manufacturing a semiconductor package structure according to some embodiments of the present disclosure.

Referring to FIG. 9, the assembly 4' of the tape 2, the package body 1 and the film 3 sucked by the first chuck 8 is turned over in the overturning unit 54 (FIG. 1) so that the assembly 4' of the tape 2, the package body 1 and the film 3 is attached to or fixed on a second chuck 8' by suction, for example, vacuum suction. That is, the overturning unit 54 is used for turning over the assembly 4' of the package body 1, the tape 2 and the film 3. In addition, the second chuck 8' is utilized to suck the assembly 4' of the tape 2, the package body 1 and the film 3. The second chuck 8' has a receiving surface 81', and includes a plurality of suction holes 83'. Each of the suction holes 83' is communicated with a vacuum source, and has an opening at the receiving surface 81'. In some embodiments, the assembly 4' is sucked on the receiving surface 81' of the second chuck 8' through the suction holes 83'. The film 3 of the assembly 4' may contact the receiving surface 81' of the second chuck 8'. Then, the first chuck 8 is removed.

Figure 10:
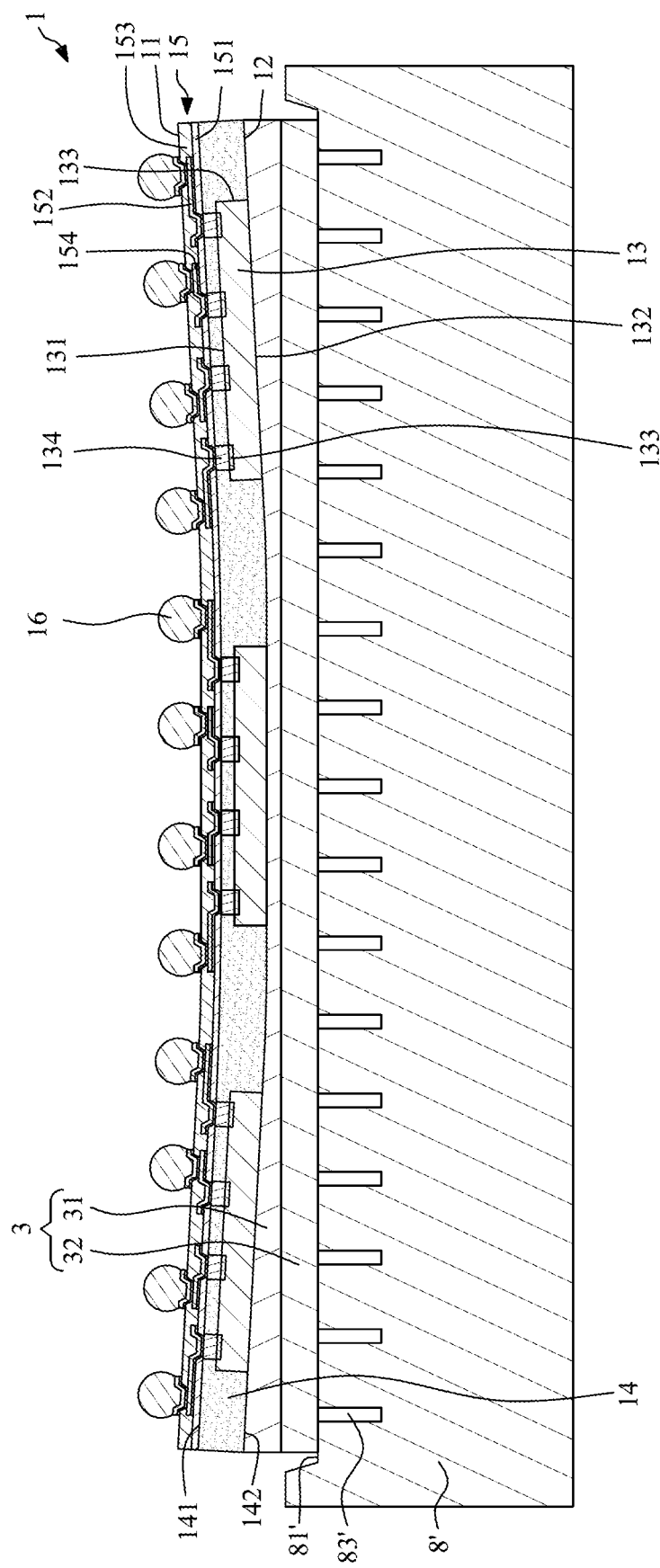
FIG. 10 illustrates one or more stages of an example of a method for manufacturing a semiconductor package structure according to some embodiments of the present disclosure.

Referring to FIG. 10, the assembly 4' and the second chuck 8' may be provided or moved to the tape removing unit 55 (FIG. 1). In the tape removing unit 55, the tape 2 is removed from the package body land the external connectors 16 are exposed. That is, the film-removing unit 53 may be used for removing the tape 2. Since the adhesive of the tape 2 is released or reduced, the tape 2 may be removed easily and no residue will be left on the package body 1 after removal.

Then, the package body 1 and the film 3 that are sucked on the second chuck 8' may be provided or moved to the curing unit 56 (FIG. 1). In the curing unit 56, the back side coating film 31 of the film 3 may be cured or solidified. That is, the curing unit 56 may be used for curing or solidifying the back side coating film 31 of the film 3.

Then, the package body 1 and the film 3 are removed from the second chuck 8', and then may be provided or moved to the marking unit 57 (FIG. 1). In the marking unit 57, a mark may be formed on or in the back side coating film 31 of the film 3. That is, the marking unit 57 may be used for forming a mark on or in the back side coating film 31 of the film 3. It is noted that during the formation of the mark, the dicing tape 32 is still on the back side coating film 31. Thus, the light irradiation source (e.g., laser light) that is used for forming the mark may pass through the dicing tape 32 of the film 3.

Figure 11:
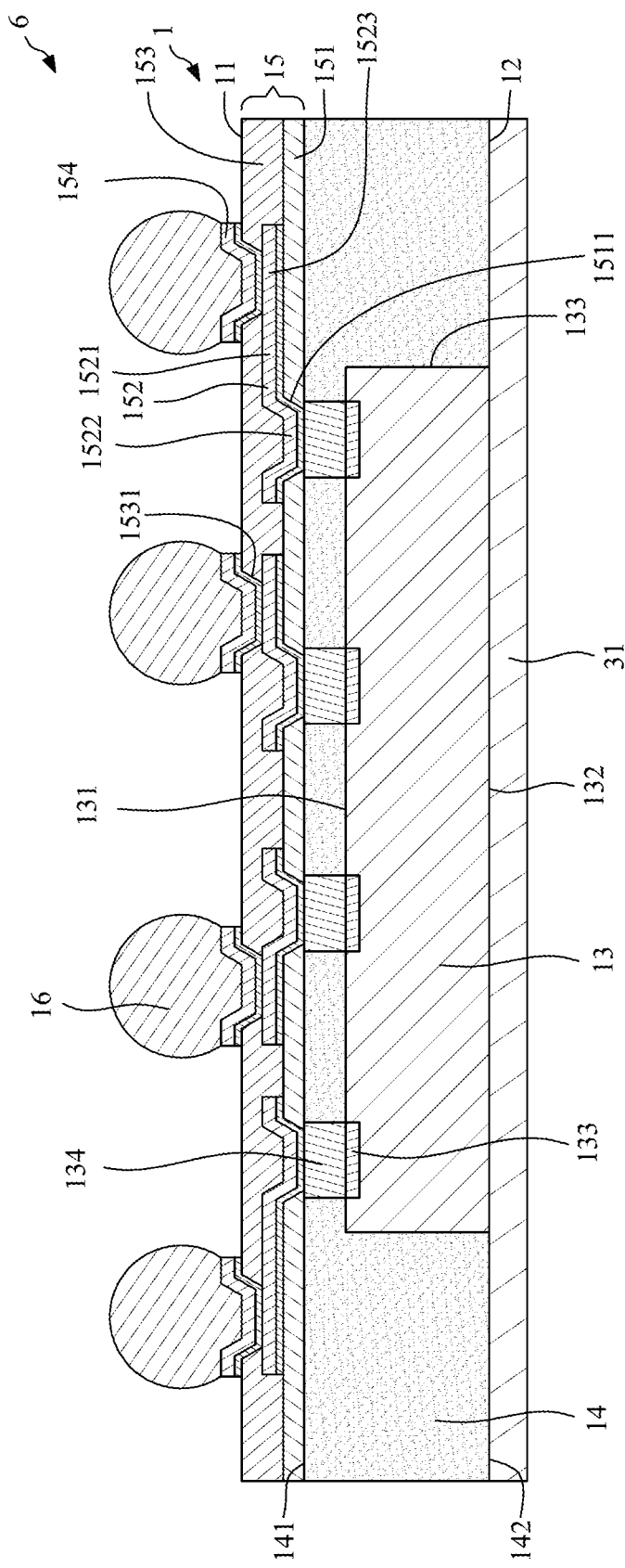
FIG. 11 illustrates one or more stages of an example of a method for manufacturing a semiconductor package structure according to some embodiments of the present disclosure.

Referring to FIG. 11, the package body 1 and the film 3 may be provided or moved to the sawing unit 58 (FIG. 1). In the sawing unit 58, the package body 1 and the film 3 may be attached to or mounted on a cutting frame, and then they are sawed or singulated to form a plurality of semiconductor package structures 6 of FIG. 11.

As shown in FIG. 11, the semiconductor package structure 6 may include the singulated package body 1 and the singulated back side coating film 31. The singulated package body 1 may include the semiconductor device 13, the encapsulant 14, the redistribution structure 15, the UBMs 154 and the external connectors 16.

Figure 12:
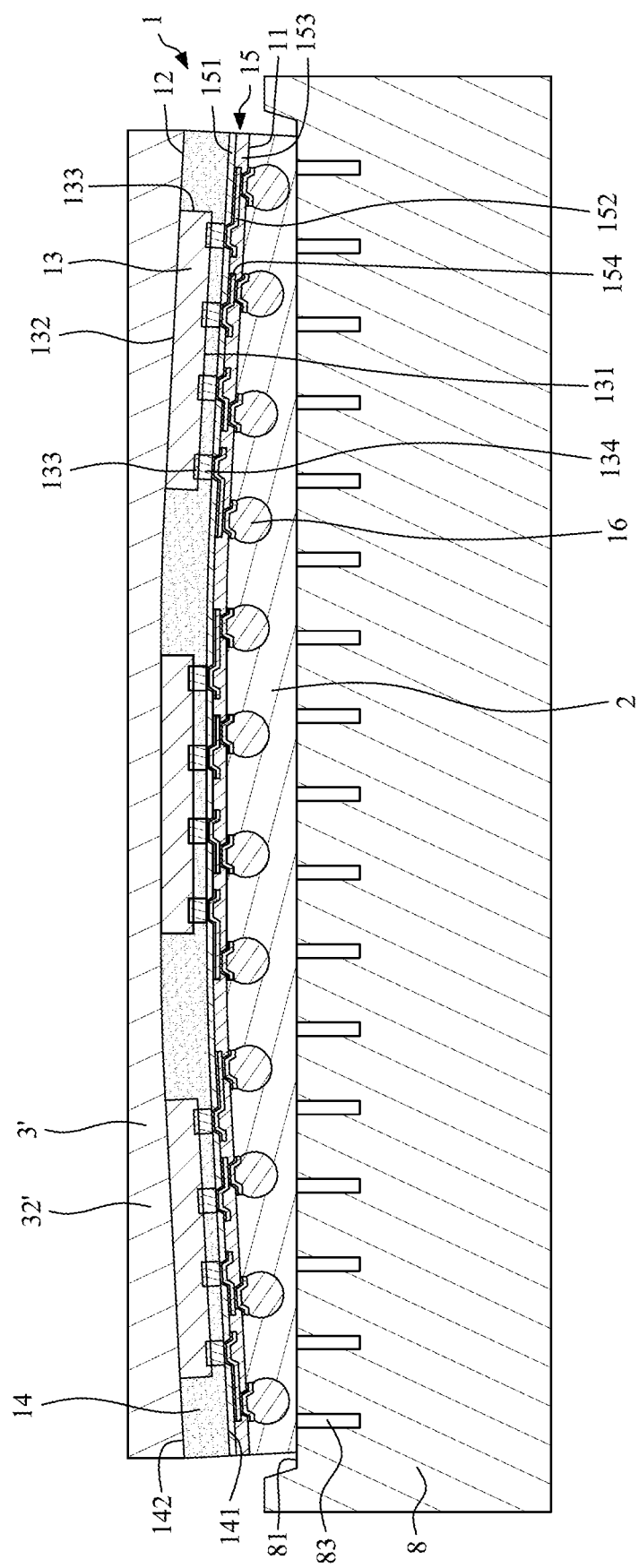
FIG. 12 illustrates one or more stages of an example of a method for manufacturing a semiconductor package structure according to some embodiments of the present disclosure.

FIG. 12 illustrates a method for manufacturing a semiconductor package structure according to some embodiments of the present disclosure. The initial stages of the illustrated process are the same as, or similar to, the stage illustrated in FIG. 2 to FIG. 7. FIG. 12 depicts a stage subsequent to that depicted in FIG. 7.

Referring to FIG. 12, the thinned package body 1 and the tape 2 that are sucked on the first chuck 8 may be provided or moved to the film attaching unit 53 (FIG. 1). In the film attaching unit 53, a film 3' may be formed or disposed on the second surface 12 of the package body 1. In some embodiments, the film 3' may be a single layer structure that is a dicing tape 32'. The dicing tape 32' may be used in a dicing step or a sawing step, and a thickness of the dicing tape 32' may be about 80 μm to about 100 μm.

Then, the following stages of the method may be similar to the stages illustrated in FIG. 9 to FIG. 11 so as to obtain a plurality of semiconductor package structures. The semiconductor package structure formed from the illustrated process may be similar to the semiconductor package structure 6 of FIG. 11, except that the semiconductor package structure of the illustrated embodiment may not include the back side coating film 31.

Figure 13:
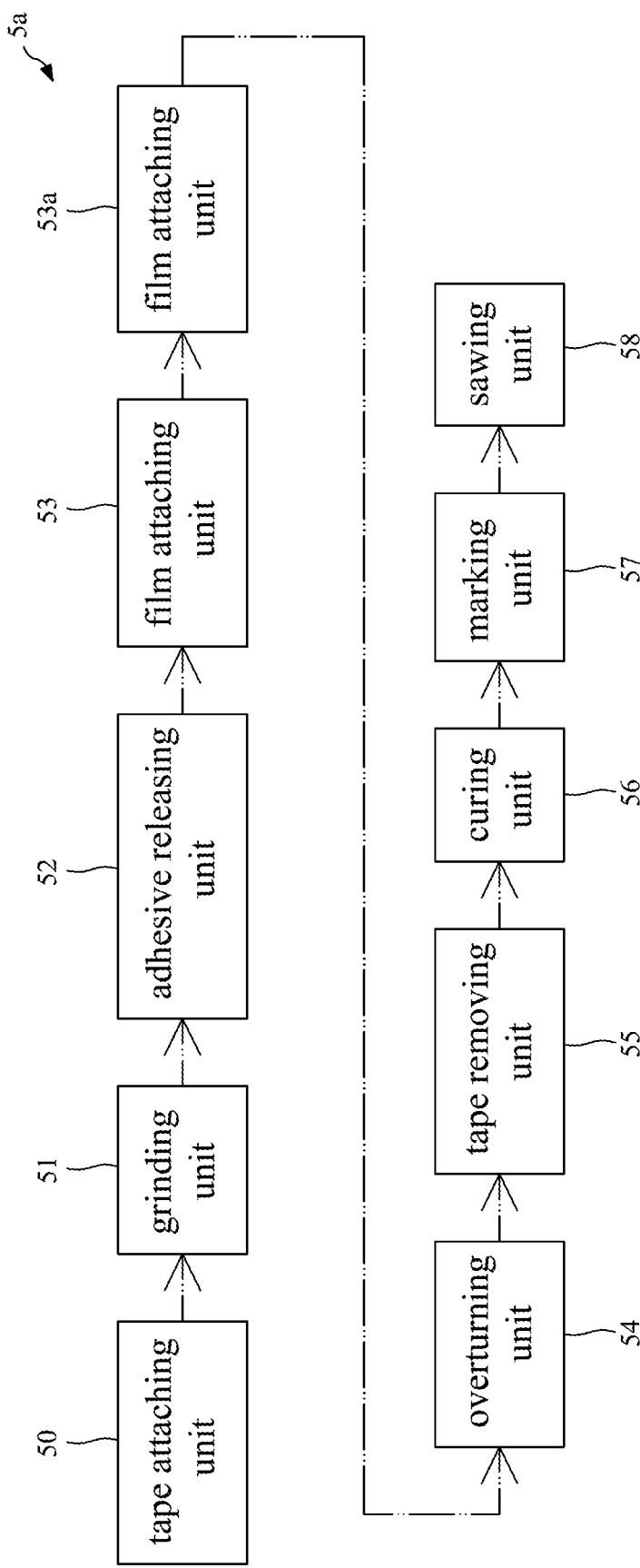
FIG. 13 illustrates a schematic arrangement of a system for manufacturing a semiconductor package structure according to some embodiments of the present disclosure.

FIG. 13 illustrates a schematic arrangement of a system 5a for manufacturing a semiconductor package structure according to some embodiments of the present disclosure. The system 5a of FIG. 13 is similar to the system 5 of FIG. 1, except that the system 5a of FIG. 13 further include an additional film attaching unit 53a disposed between the film attaching unit 53 and the tape removing unit 55.

Figure 14:
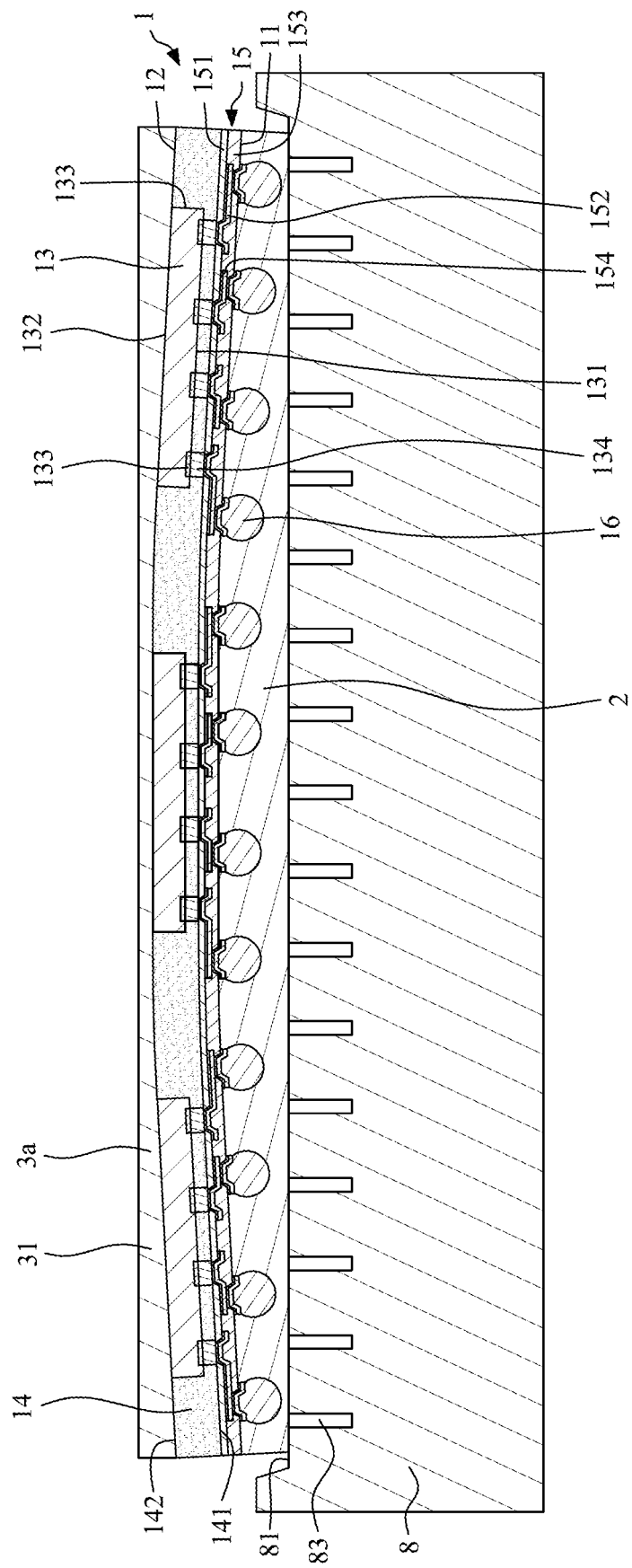
FIG. 14 illustrates one or more stages of an example of a method for manufacturing a semiconductor package structure according to some embodiments of the present disclosure.
Figure 15:
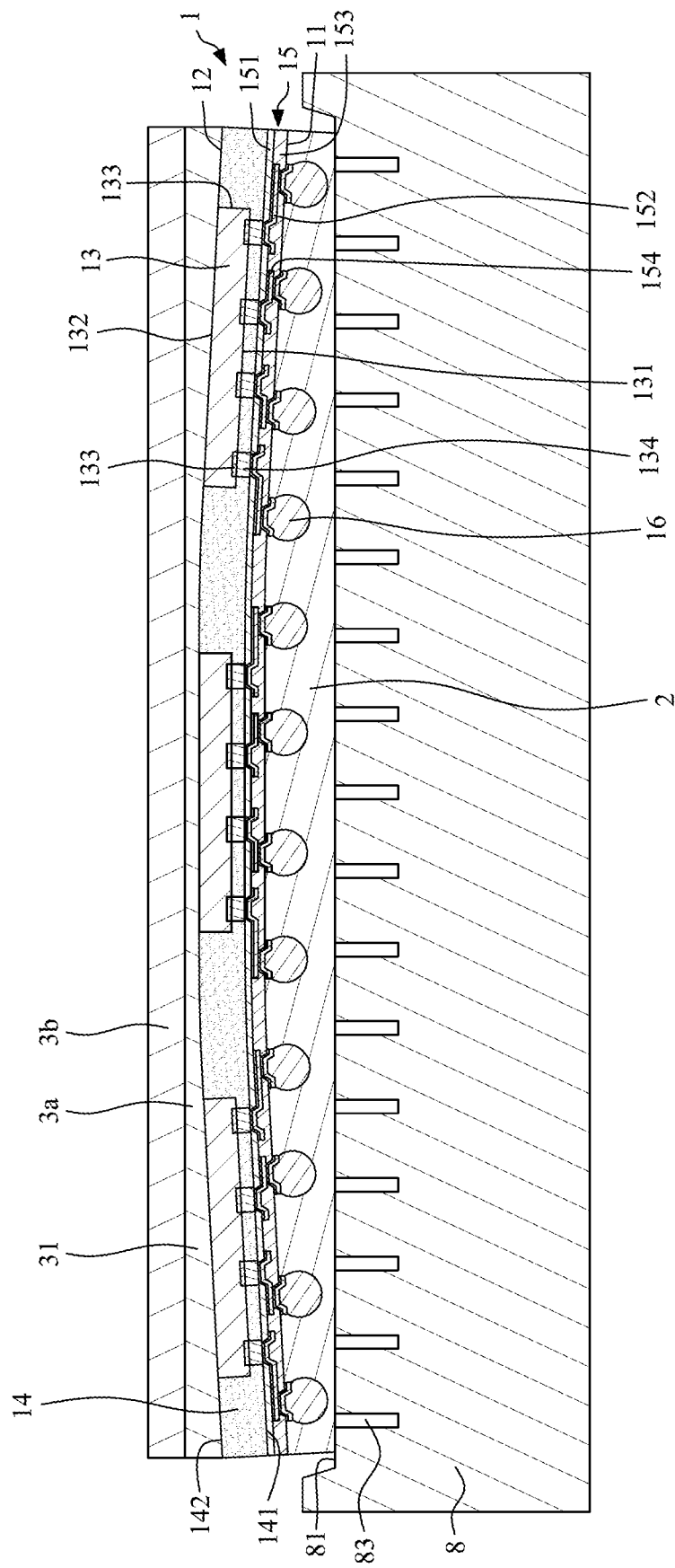
FIG. 15 illustrates one or more stages of an example of a method for manufacturing a semiconductor package structure according to some embodiments of the present disclosure.

FIG. 14 through 15 illustrates a method for manufacturing a semiconductor package structure according to some embodiments of the present disclosure. In some embodiments, the method is for manufacturing the semiconductor package structure 6 shown in FIG. 11. The initial stages of the illustrated process are the same as, or similar to, the stage illustrated in FIG. 2 to FIG. 7. FIG. 14 depicts a stage subsequent to that depicted in FIG. 7.

Referring to FIG. 14, the thinned package body 1 and the tape 2 that are sucked on the first chuck 8 may be provided or moved to the film attaching unit 53 (FIG. 13). In the film attaching unit 53, a film 3a may be formed or disposed on the second surface 12 of the package body 1. In some embodiments, the film 3a may be a single layer structure that is a back side coating film 31.

Referring to FIG. 15, the film 3a, the thinned package body 1 and the tape 2 that are sucked on the first chuck 8 may be provided or moved to the additional film attaching unit 53a (FIG. 13). In the additional film attaching unit 53a, a film 3b may be attached or disposed on the film 3a (e.g., the back side coating film 31). In some embodiments, the film 3b may be a single layer structure that is a dicing tape.

Then, the following stages of the method may be similar to the stages illustrated in FIG. 9 to FIG. 11 so as to obtain a plurality of semiconductor package structures 6 of FIG. 11.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
   providing a package body including a semiconductor device encapsulated in an encapsulant;
   removing a portion of the encapsulant to expose a plurality of stud bumps disposed over an active surface of the semiconductor device;
   attaching a first tape to a first side of the package body;
   thinning the package body;
   attaching a second tape to a second side of the package body, opposite to the first side, before removing the first tape; and
   reducing an adhesive of the first tape earlier than attaching the second tape.

2. The method of claim 1, further comprising:
   attaching the package body to a first chuck by a suction later than attaching the first tape, and earlier than thinning the package body.

3. The method of claim 2, wherein attaching the second tape is performed by a roller earlier than removing the first tape from the package body.

4. The method of claim 1, wherein reducing the adhesive of the first tape is later than thinning the package body.

5. The method of claim 4, wherein attaching the second tape to the package body is during the package body is attached to a first chuck by a suction, and is after thinning the package body.

6. The method of claim 4, further comprising:
   attaching the package body to a first chuck by a suction later than attaching the first tape; and
   turning over an assembly of the first tape, the package body and the second tape sucked by the first chuck after irradiating a UV light to the first tape.

7. The method of claim 6, further comprising:
removing the first chuck from the assembly later than attaching the package body to a second chuck by a second suction.

8. A method for manufacturing a semiconductor package structure, comprising:
providing a package body including a semiconductor device encapsulated in an encapsulant;
attaching a dicing tape to the package body;
attaching an assembly of the package body and the dicing tape to a first chuck by a suction;
turning over the assembly sucked on the first chuck; and
forming a mark by a light irradiation passing through the dicing tape later than turning over the assembly sucked on the first chuck.

9. The method of claim 8, further comprising:
forming the package body on a carrier;
attaching a back grinding (BG) tape to a first surface of the package body before attaching the carrier to a flattening chuck by a third suction, wherein a second surface of the package body opposite to the first surface of the package body faces the carrier; and
removing the carrier later than attaching the back grinding (BG) tape to the first chuck by the suction.

10. The method of claim 9, further comprising:
attaching a back side film to the package body during the back grinding (BG) tape is attached on the first chuck; and
curing the back side film later than removing the back grinding (BG) tape.

11. The method of claim 10, wherein the dicing tape and the back side film are attached to the package body at a same step.

12. The method of claim 10, further comprising:
forming a mark on the back side film by a laser passing through the dicing tape.

13. The method of claim 10, wherein a thickness of the back grinding (BG) tape is greater than a thickness of the back side film.

14. A method for manufacturing a semiconductor package structure, comprising:
forming a package body on a carrier, wherein the package body includes a semiconductor device encapsulated in an encapsulant;
attaching a back grinding (BG) tape to a first surface of the package body, wherein a second surface of the package body opposite to the first surface of the package body faces the carrier;
attaching the carrier to a flattening chuck by a third suction later than attaching the back grinding (BG) tape to the first surface of the package body;
attaching a combination of a dicing tape and a back side film to the package body;
forming a mark on the back side film by a light irradiation passing through the dicing tape; and
curing the back side film before forming the mark on the back side film, and after attaching the combination of the dicing tape and the back side film to the package body.

15. The method of claim 14, further comprising:
removing the carrier during the back grinding (BG) tape is attached to a first chuck by a suction.

16. The method of claim 14, wherein attaching the combination of the dicing tape and the back side film to the package body is during the package body is attached to a first chuck by a suction.

17. The method of claim 16, further comprising:
turning over an assembly of the package body and the combination of the dicing tape and the back side film sucked by the first chuck.

18. The method of claim 17, further comprising:
attaching the assembly to a second chuck by a second suction earlier than removing the first chuck from the assembly.

19. The method of claim 18, wherein attaching the back grinding (BG) tape to the package body is before attaching the combination of the dicing tape and the back side film to the package body.

* * * * *